Figure 1:
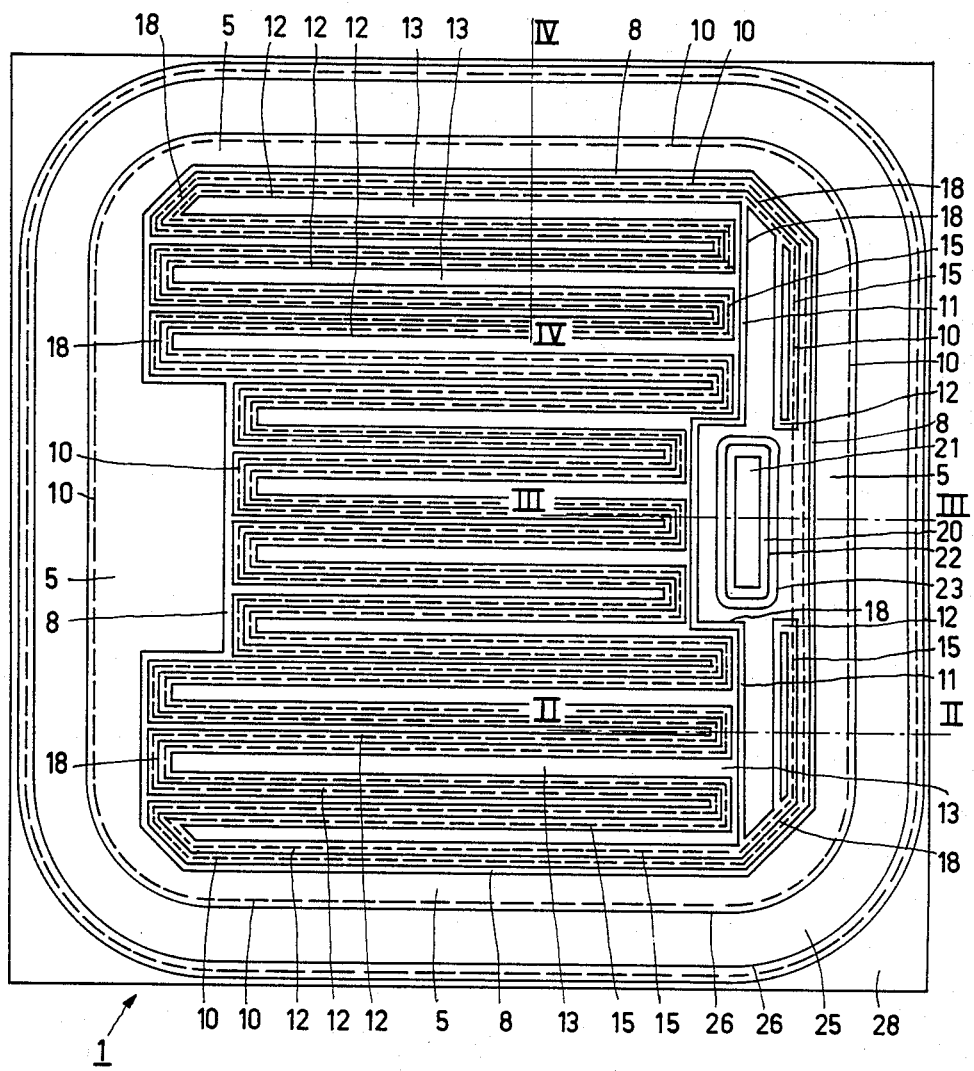

United States Patent [19]

van De Wouw et al.

[11] Patent Number: 4,530,000
[45] Date of Patent: Jul. 16, 1985

[54] BIPOLAR TRANSISTOR WITH PROTECTIVE DIODE IN COLLECTOR

[75] Inventors: Martinus L. J. A. van De Wouw; Henri J. F. Kool Van Langenberghe, both of Nijmegen, Netherlands

[73] Assignee: U.S. Philips Corporation, New York, N.Y.

[21] Appl. No.: 310,581

[22] Filed: Oct. 13, 1981

[30] Foreign Application Priority Data

Nov. 3, 1980 [NL] Netherlands ................ 8005995

[51] Int. Cl.³ .................................... H01L 27/02
[52] U.S. Cl. .................................. 357/46; 357/34; 357/13
[58] Field of Search .................... 357/46, 34, 13

[56] References Cited

U.S. PATENT DOCUMENTS 4,078,244  3/1978  Bonis ........................... 357/46
4,288,807  9/1981  Enzlin et al. ................. 357/56
4,293,868  8/1981  Iizuka et al. ................. 357/46

Primary Examiner—Andrew J. James
Assistant Examiner—William A. Mintel
Attorney, Agent, or Firm—Paul R. Miller

[57] ABSTRACT

A semiconductor device, comprising a semiconductor body with a bipolar transistor with a collector zone which is formed by a part of a semiconductor region, a base zone and an emitter zone which is embedded in the base zone. The base zone is connected to a base metallization and the emitter zone is connected to an emitter metallization which comprises an emitter connection electrode. Between the emitter and the collector of the transistor there is connected a diode with a first zone which forms part of the semiconductor region and a second zone which is completely surrounded by the first zone and in projection is completely situated within the emitter connection electrode. This emitter connection electrode is connected to the second zone of the diode.

4 Claims, 4 Drawing Figures

BIPOLAR TRANSISTOR WITH PROTECTIVE DIODE IN COLLECTOR

The invention relates to a semiconductor device, comprising a semiconductor body with a bipolar transistor which comprises a collector zone which is formed by at least a part of a semiconductor region of a first conductivity type, a base zone of the second, opposite conductivity type which adjoins the collector zone and a surface of the semiconductor body which is partly covered with an insulating layer with the base zone contacting a base metallization via a base contact window in the insulating layer, and an emitter zone of the first conductivity type which is embedded in the base zone and which contacts, via an emitter contact window in the insulating layer, an emitter metallization with an emitter connection electrode which can be connected to a connection conductor, between the emitter and the collector of the transistor there being connected a diode having a first zone formed by a part of the region of the first conductivity type and a second zone of the second conductivity type thereof adjoining the surface and contacting the emitter metallization.

A semiconductor device of this kind can be used, for example, as a switching transistor in circuits for horizontal deflection in television receivers. The diode which is connected between the emitter and the collector of the transistor and which is also referred to as an efficiency diode serves notably to increase the linearity of the circuit.

From Netherlands patent application No. 78.03.706 laid open to public inspection, and corresponding to U.S. Pat. No. 4,288,807 a semiconductor device of the described kind is known in which the second zone of the diode which adjoins the surface is situated adjacent the transistor in the semiconductor body and contacts a separate branch of the emitter metallization. The second zone of the diode and the base zone of the transistor form part of the same semiconductor region of the second conductivity type. In this region, between the second zone of the diode and the base zone of the transistor there is provided an isolating resistor which prevents the base emitter junction of the transistor from being substantially short-circuited at least locally via the semiconductor region and via the emitter metallization which is connected to the second zone of the diode as well as to the emitter zone of the transistor.

It is a drawback of the described known semiconductor device that the diode and its isolating resistor are present within the semiconductor body adjacent the transistor. A part of the surface area of the semiconductor body is thus occupied which cannot be used for the formation of the transistor. As a result, the power which can be switched by the transistor is smaller than if the surface area were utilized for the formation of the transistor.

It is one of the objects of the invention to provide a semiconductor device with a bipolar transistor and an efficiency diode of the described kind in which this drawback is mitigated.

The invention is inter alia based on the recognition of the fact that this object can be achieved by including the diode in the transistor structure.

To this end, a semiconductor device of the kind set forth in accordance with the invention is characterized in that the second zone of the diode is completely surrounded by the first zone and in projection is situated completely within the emitter connection electrode which contacts the second zone via a contact window in the insulating layer. The diode is now situated completely underneath the emitter connection electrode, so that it is included in the transistor structure. This does not require an additional part of the surface area of the semiconductor body which can, therefore, be optimally used for the formation of the transistor. The first zone of the diode is present between the second zone of the diode and the base zone of the transistor. This means that a blocked p-n junction is present between the second zone of the diode and the base zone of the transistor in the operating condition. As a result, short circuiting of the base-emitter junction of the transistor via the semiconductor body and the emitter metallization is prevented. The isolation between the second zone of the diode and the base zone of the transistor is thus very efficient and, moreover, requires so little space that the diode and the isolation can be accommodated together completely underneath the emitter connection electrode. An isolating resistor, such as used in the described known semiconductor device, is completely eliminated by the step in accordance with the invention.

A preferred embodiment of the semiconductor device in accordance with the invention is characterized in that the edge of the second zone of the diode is situated at such a small distance from the base zone of the transistor that the depletion zones of the collector-base junction of the transistor and of the p-n junction of the diode change into one another in the operating condition. It is thus achieved that the equipotential surfaces in the semiconductor region of the first conductivity type are substantially not disturbed by the presence of the diode. The breakdown voltage of the semiconductor could otherwise be adversely affected thereby.

A semiconductor device of the kind set forth which can be simply manufactured in accordance with the invention is characterized in that the second zone of the diode extends to substantially the same depth as the base zone of the transistor. The second zone of the diode and the base zone of the transistor can then be formed in the semiconductor body in one operation, for example, by diffusion. The number of extra process steps required for the manufacture of an efficiency diode in the semiconductor device with transistor is thus reduced.

Figure 2:
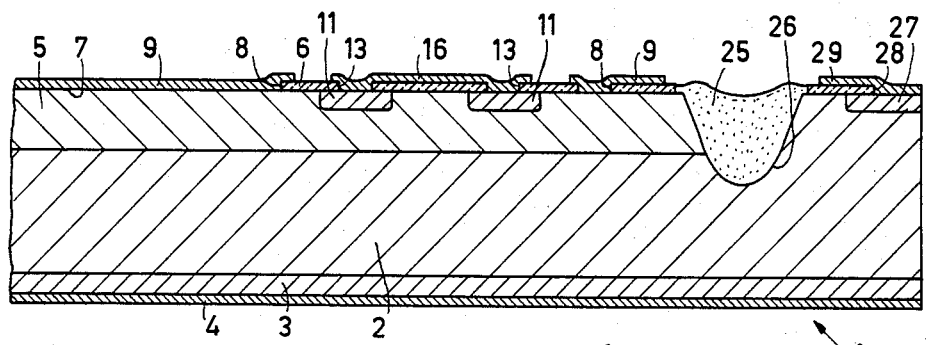
Figure 3:
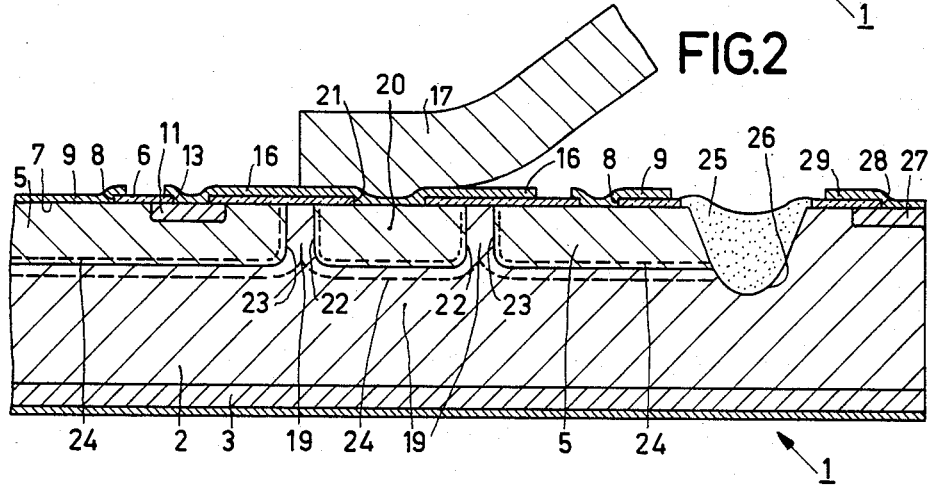
Figure 4:
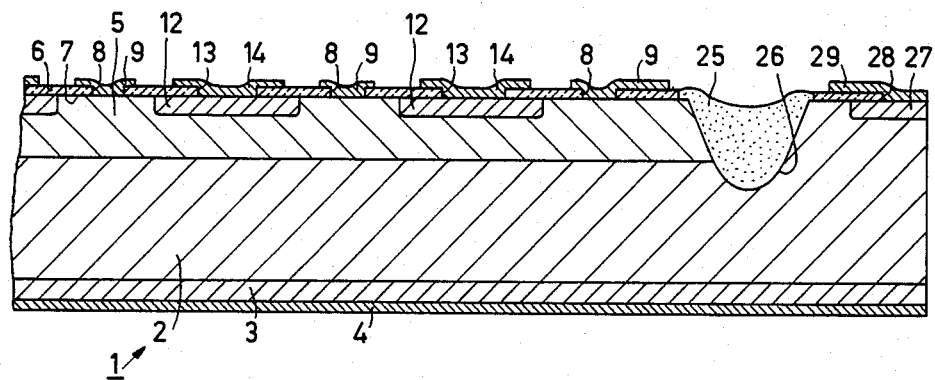

The invention will be described in detail hereinafter, by way of example, with reference to the accompanying diagrammatic drawing. In the drawing:

FIG. 1 is a plan view of a semiconductor device in accordance with the invention, FIG. 2 is a cross-sectional view, taken along the line II—II in FIG. 1, of the semiconductor device, FIG. 3 is a cross-sectional view, taken along the line III—III in FIG. 1, of the semiconductor device, and FIG. 4 is a cross-sectional view, taken along the line IV—IV in FIG. 1, of the semiconductor device.

The figures are diagrammatical representations and are not to scale; for the sake of clarity, notably the dimensions in the thickness direction in the cross-sectional views are strongly exaggerated. Semiconductor zones of the same conductivity type are shaded in the same direction; corresponding parts in the figures are denoted by corresponding reference numerals.

The semiconductor device shown in the Figures 1 to 4 comprises a semiconductor body 1 with a bipolar transistor. The semiconductor body 1 is made of a suitable semiconductor material such as silicon and comprises a semiconductor region 2 of a first conductivity type, in this example n-type having a comparatively low doping concentration of approximately $10^{14}$ atoms per cc and a thickness of, for example, 90 μm. Via an n-type zone 3 having a comparatively high doping concentration of, for example, $10^{20}$ atoms per cc and a thickness of, for example 7 μm, the semiconductor region 2 is connected to an electrode layer 4.

The bipolar transistor comprises a collector zone which is formed by the part of the semiconductor region 2 which adjoins a base zone 5 of the second, opposite conductivity type, so in this example p-type, which has a thickness of, for example, 30 μm. The base zone 5 in its turn adjoins a surface 7 of the semiconductor body 1 which is partly covered with an insulating layer 9 of, for example, silicon oxide. The base zone 5 is connected, via a base contact window 8 in an insulating layer 9, to a base metallization 6 of, for example, aluminium whose edges are denoted by the broken lines 10 in FIG. 1. The base zone 5 includes an emitter zone 11 of the first conductivity type, i.e. in this case n-type, which has a thickness of, for example, 7 μm and which comprises a number of strip-shaped emitter zones 12, which are also referred to as emitter fingers. By an emitter contact window 13 in the insulating layer 9, the emitter zone 11 with the emitter fingers 12 is connected to an emitter metallization whose edges are denoted by means of the broken line 15 in FIG. 1. The emitter metallization 14, see FIG. 4, comprises an emitter connection electrode 16 which is in this case connected to a connection conductor 17 which is shown only in FIG. 3 for the sake of simplicity. The emitter connection electrode 16 has a comparatively large surface area; in this case, it is shaped like a strip having a width of approximately 500 μm in the center. As a result, contact on a comparatively large surface area is possible, so that the connection conductor 17 can be mechanically fitted during bulk manufacture of the semiconductor device.

The base zone 5 and the emitter zone 11 with its emitter fingers 12 form a p-n junction which terminates at the surface 7 according to a line which is denoted by the reference numeral 18 in FIG. 1.

Between the emitter and the collector of the transistor, that is to say between the emitter metallization 14, 16 and the electrode layer 4, there is connected a diode, a first zone of which is formed by a part 19 of the region of the first conductivity type 2, the second zone 20 of the second conductivity type thereof adjoining the surface 7 and contacting the emitter metallization 14, 16.

In accordance with the invention, the second zone 20 of the diode is completely surrounded by the first zone 19 except for a portion at the surface 7 and in projection it is situated completely within the emitter connection electrode 16. The emitter connection electrode 16 is connected to the second zone 20 via a contact window 21 in the insulating layer 9. As a result, the diode is situated completely underneath the emitter connection electrode 16. This does not require an additional part of the surface 7 of the semiconductor body 1 which, consequently, can be optimally used for the formation of the transistor 11, 12, 5 and 2. The first zone 19 of the diode is present between the second zone 20 of the diode and the base zone 5 of the transistor. This means that between the second zone 20 and the base zone 5 a blocked p-n junction is present in the operating condition. As a result, short-circuiting of the base-emitter junction of the transistor via the semiconductor body and the emitter metallization 14, 16 is prevented. This isolation between the second zone 20 and the base zone 5 is very efficient and, moreover, requires so little space that the diode 19, 20 can be accommodated completely underneath the emitter connection electrode 16 together with the isolation.

The edge 22 of the second zone 20 of the diode is situated at such a small distance from the edge 23 of the base zone 5 that the depletion zones of the collector-base junction (2, 5) of the transistor, denoted by broken lines 24, and of the p-n junction (19, 20) of the diode merge into one another in the operating condition. It is thus achieved that the equipotential surfaces in the semiconductor region 2 of the first conductivity type are substantially not disturbed by the presence of the diode 19, 20 in the operating condition. The breakdown voltage of the semiconductor device would otherwise be adversely affected thereby. The distance between the edges 22 and 23 amounts to approximately 80 μm.

The second zone 20 of the diode extends substantially to the same depth as the base zone 5 of the transistor. Both zones 20 and 5, therefore, can be formed in one operation, for example, by diffusion. As a result, the number of process steps required for the manufacture of the diode (19, 20) in the semiconductor device is limited.

In order to counteract breakdowns at the edges of the semiconductor body 1, it is provided in a customary manner with a groove 26 which is filled with a passivation glass 25 and a so-called channel-stopper zone 27 of the first conductivity type which has a depth which substantially equals that of the emitter regions 11 and 12. This channel stopper zone 27 is connected to a metallization 29 via a contact window 28.

The described semiconductor device can be manufactured completely by means of the methods customarily used in the semiconductor technique.

It will be obvious that the invention is not restricted to the described embodiment with a single transistor on a semiconductor body, but that within the scope of the invention many variations will be feasible for those skilled in the art. For example, the invention can be used for transistors which form part of an integrated circuit, for example, a Darlington circuit.

For example, the conductivity type of all semiconductor zones and regions in the embodiment can be (simultaneously) replaced by the opposite type. Instead of silicon, another semiconductor material can be used, such as germanium or a III-V compound such as gallium arsenide. Instead of silicon oxide, use can be made of another insulating layer of, for example, organic lacquer, and for the metallization other metals such as tungsten or chromium can be used instead of aluminium.

What is claimed is:

1. A semiconductor device including a semiconducting body for a bipolar transistor, said device comprising:
    a first semiconductor area being a collector zone of a first conductivity type,
    a second semiconductor area being a base zone of a second opposite conductivity type, said base zone being disposed between said collector zone and a surface of said semiconductor body,
    a third semiconductor area being an emitter zone of said first conductivity type embedded into said base zone,
    an insulating layer covering at least a portion of said surface, a base metallization contacting said base zone through a first window in said insulating layer, an emitter metallization forming an emitter connection electrode to said emitter zone through a second window in said insulating layer, a connection conductor connected to said emitter connection electrode, and a diode located in said collector zone, said diode including a first region of said first conductivity type and a second region of said second conductivity type entirely surrounded by said first region except for a portion adjoining said surface and contacting said emitter metallization and said connector conductor, said first region including at least a portion between said base zone and said second region, said second region being located entirely below said emitter connection electrode, said emitter connection electrode contacting said second region through a third window in said insulating layer.

2. A semiconductor device according to claim 1, wherein said second region of said diode is situated at a small distance from said base zone, said small distance being such that depletion zones of a collector-base junction and of a p-n junction of said diode merge in an operating state.

3. A semiconductor device according to claim 2, wherein said second region of said diode extends below said surface to substantially the same depth that said base zone does.

4. A semiconductor device according to claim 1, wherein said second region of said diode extends below said surface to substantially the same depth that said base zone does.

* * * * *